(12) United States Patent
Murase et al.

(10) Patent No.: US 6,259,394 B1
(45) Date of Patent: Jul. 10, 2001

(54) ELECTRIC WAVE ABSORBER

(75) Inventors: Taku Murase; Naoyoshi Sato; Hiroshi Kurihara; Toshifumi Saitoh; Motonari Yanagawa, all of Tokyo; Kozo Hayashi; Kyoichi Fujimoto, both of Gifu, all of (JP)

(73) Assignees: TDK Corporation, Tokyo (JP); Tokiwa Electric Co., Kakamigahara (JP)

( * ) Notice: Subject to any disclaimer, the term of this patent is extended or adjusted under 35 U.S.C. 154(b) by 0 days.

(21) Appl. No.: 09/390,293

(22) Filed: Sep. 3, 1999

(30) Foreign Application Priority Data

Sep. 4, 1998 (JP) .................................. 10-267241
Sep. 4, 1998 (JP) .................................. 10-267242

(51) Int. Cl.$^7$ .................................................. H01Q 17/00
(52) U.S. Cl. ........................................ 342/1; 342/3; 342/4
(58) Field of Search ..................................... 342/1, 2, 3, 4

(56) References Cited

U.S. PATENT DOCUMENTS

| | | | |
|---|---|---|---|
| 3,568,195 | * 3/1971 | Wesch et al. | 342/1 |
| 5,248,553 | * 9/1993 | Miyashita et al. | 428/297.1 |
| 5,304,750 | * 4/1994 | Schubert et al. | 181/294 |
| 5,324,766 | * 6/1994 | Ikejiri et al. | 524/433 |
| 5,396,249 | * 3/1995 | Yamada et al. | 342/1 |
| 5,455,116 | * 10/1995 | Nagano et al. | 428/545 |
| 5,455,117 | * 10/1995 | Nagano et al. | 428/545 |
| 6,061,011 | * 5/2000 | Yamamoto et al. | 342/1 |

FOREIGN PATENT DOCUMENTS

| | | |
|---|---|---|
| 0 689 262 | 12/1995 | (EP) . |
| 57-34396 | 2/1982 | (JP) . |
| 57-34398 | 2/1982 | (JP) . |
| 5-280121 | 10/1993 | (JP) . |
| 8-1854 | 1/1996 | (JP) . |
| 9-208718 | 8/1997 | (JP) . |
| 2743227 | 2/1998 | (JP) . |

OTHER PUBLICATIONS

Patent Abstracts of Japan, vol. 015, No. 284 (E–1091), Jul. 18, 1991, JP 03–099496, Apr. 24, 1991.
Patent Abstracts of Japan, vol. 1996, No. 07, Jul. 31, 1996, JP 08–083992, Mar. 26, 1996.
Patent Abstracts of Japan, vol. 1998, No. 13, Nov. 30, 1998, JP 10–217217, Aug. 18, 1998.

(List continued on next page.)

*Primary Examiner*—John B. Sotomayor
(74) *Attorney, Agent, or Firm*—Oblon, Spivak, McClelland, Maier & Neustadt, P.C.

(57) ABSTRACT

An electrically conductive member constituted by at least one member of the group consisting of carbon black, graphite and carbon fiber, a powdered or granulated material of an inorganic hollow body and inorganic reinforcing fiber are bonded to one another by an inorganic adhesive agent to thereby form an electric wave absorber. The electric wave absorber exhibits excellent electric wave absorbing power because of both the electrically conductive member and the powdered or granulated material of the inorganic hollow body which are contained in the electric wave absorber. The electric wave absorber has excellent mechanical strength because of the inorganic reinforcing fiber which is contained in the electric wave absorber. The electric wave absorber exhibits excellent nonflammable characteristic because of both the powdered or granulated material of the inorganic hollow body and the inorganic reinforcing fiber which are contained in the electric wave absorber. Preferably, the electric wave absorber is provided with a nonflammable layer which is integrally bonded to at least one portion thereof and which is constituted by at least one member of the group consisting of a nonflammable sheet made from a slurry containing sepiolite as a main component, and an inorganic coating agent layer.

26 Claims, 2 Drawing Sheets

OTHER PUBLICATIONS

Patent Abstracts of Japan, vol. 1997, No. 10, Oct. 31, 1997, JP 09–148779, Jun. 6, 1997.

"Development of incombustible radio frequency (RF) absorber", Shinozaki, Y.; Shimada, K., Electromagnetic Compatibility, 1995. Symposium Record., 1995 IEEE International Symposium on, 1995 pp.: 557–562.*

"Electromagnetic absportion and shield properties of lossy composite multilayers", Miyazaki, Y.; Tanoue, K., Electromagentic Compatibility, 1990. Symposium Record., 1990 IEEE International Symposium on, 1990 pp.: 370–374, 1995.*

* cited by examiner

ELECTRIC WAVE ABSORBER

BACKGROUND OF THE INVENTION

The present invention relates to an electric wave absorber used in an electric wave dark room, an electric wave absorbing wall, etc.

In recent years, use of electric waves has been spread rapidly in the field of mobile communication the like to realize a high-grade information oriented society. On the other hand, various electronic appliances have been popularized with the reformative advance of today's microelectronics technology. With the advance of such information communication technology, however, the influence of unnecessary electromagnetic noise on apparatuses relevant to precision machinery has become a subject of discussion.

An electric wave dark room (electric wave anechoic room) having no electromagnetic wave reflection is used for measurement of electromagnetic noise. An electric wave absorber is disposed in an inner wall of such an electric wave dark room. Examples of the background-art electric wave absorber used in the electric wave dark room include electric wave absorbers made from organic materials such as foamed styrol, foamed styrene, foamed urethane, etc., mixed with carbon black, or the like, to obtain electrical conductivity.

With the increase of electric wave interference, however, a large electric power test such as an immunity test, or the like, has been intended as a matter of duty. In the electric wave dark room used in a closed state, a nonflammable material needs to be used in terms of improvement of safety.

An example of the nonflammable electric wave absorber include a molded material containing inorganic grains, comparatively low in raw material cost and having a large number of closed cells, such as SHIRASU balloons, glass beads, perlite, etc., and carbon black which are integrally bonded by a heat-resistant inorganic adhesive agent such as water-glass (Japanese Patent No. 2743227).

The aforementioned electric wave absorber is, however, low in mechanical strength. There is a problem that the occurrence of breaking, the generation of dust upon collision, etc. cannot be avoided when, for example, the electric wave absorber is provided as a quadrangular pyramid- or wedge-shaped large-size structure which is about 100 cm high.

SUMMARY OF THE INVENTION

The present invention is designed upon the aforementioned actual circumstances. The object of the present invention is to provide an electric wave absorber which is light in weight and which is excellent in mechanical strength, nonflammable characteristic and electric wave absorbing power.

In order to achieve the above object, according to an aspect of the present invention, there is provided an electric wave absorber which is formed by bonding a powdered or granulated material of an inorganic hollow body and inorganic reinforcing fiber to at least one member of the group consisting of carbon black, graphite and carbon fiber as an electrically conductive member by an inorganic adhesive agent.

Preferably, the amount of the electrically conductive member is in a range of from 0.5 to 80 g/l. Preferably, the amount of carbon black and/or graphite as the electrically conductive member is in a range of from 30 to 50 g/l. Preferably, the amount of carbon fiber as the electrically conductive member is in a range of from 0.5 to 15 g/l.

Preferably, the inorganic hollow body is constituted by at least one member of the group consisting of SHIRASU balloons, silica balloons, glass beads, and alumina-silica balloons. Preferably, the mean grain size of the inorganic hollow body is in a range of from 5 to 1000 $\mu$m.

Preferably, the inorganic reinforcing fiber is constituted by at least one member of the group consisting of glass fiber, rock wool fiber, stainless steel fiber, silica-alumina fiber, and potassium titanate fiber. Preferably, the amount of the inorganic reinforcing fiber is in a range of from 1 to 20 g/l.

Preferably, the electric wave absorber is provided with a nonflammable layer which is integrally bonded to at least one portion thereof and which is constituted by at least one member of the group consisting of a nonflammable sheet made from a slurry containing sepiolite as a main component, and an inorganic coating agent layer.

Preferably, the electric wave absorber is provided as a quadrangular pyramid- or wedge-shaped structure which is hollow in its inside. Preferably, the nonflammable layer is integrally bonded to at least one exposed portion of the electric wave absorber.

In the present invention, the electrically conductive member and the powdered or granulated material of the inorganic hollow body give excellent electric wave absorbing power to the electric wave absorber whereas the inorganic reinforcing fiber gives mechanical strength to the electric wave absorber. Furthermore, the powdered or granulated material of the inorganic hollow body and the inorganic reinforcing fiber have a function of giving excellent nonflammable characteristic to the electric wave absorber. In addition, since the nonflammable layer is integrally bonded, the mechanical strength of the electric wave absorber is enhanced more greatly.

In order to achieve the above object, according to another aspect of the present invention, there is provided an electric wave absorber comprising an electric wave absorbing molded body, and a nonflammable layer integrally bonded to at least one portion of the electric wave absorbing molded body, wherein the electric wave absorbing molded body contains at least one member of the group consisting of carbon black, graphite, and carbon fiber as an electrically conductive member, and a powdered or granulated material of an inorganic hollow body bonded to the electrically conductive member by an inorganic adhesive agent whereas the nonflammable layer is made from at least one member of the group consisting of a nonflammable sheet made from a slurry containing sepiolite as a main component, and an inorganic coating agent layer.

Preferably, the inorganic hollow body is made from at least one member of the group consisting of SHIRASU balloons, silica balloons, glass beads, and alumina-silica balloons.

Preferably, the amount of the electrically conductive member contained in the electric wave absorbing molded body is in a range of from 0.5 to 80 g/l. Preferably, the amount of carbon black and/or graphite contained as the electrically conductive member is in a range of from 30 to 50 g/l. Preferably, the amount of carbon fiber contained as the electrically conductive member is in a range of from 0.5 to 15 g/l.

Preferably, the mean grain size of the inorganic hollow body is in a range of from 5 to 1000 $\mu$m.

Preferably, the electric wave absorbing molded body contains inorganic reinforcing fiber in addition to the powdered or granulated material of the inorganic hollow body. Preferably, the inorganic reinforcing fiber is constituted by at least one member of the group consisting of glass fiber, rock wool fiber, stainless steel fiber, silica-alumina fiber, and potassium titanate fiber. Preferably, the amount of the inorganic reinforcing fiber contained in the electric wave absorbing molded body is in a range of from 1 to 20 g/l.

Preferably, the electric wave absorber is provided as a quadrangular pyramid- or wedge-shaped structure which is hollow in its inside. Preferably, the nonflammable layer is integrally bonded to at least one face of the electric wave absorber exposed to the outside.

In the present invention, the electric wave absorbing molded body containing an electrically conductive member, a powdered or granulated material of an inorganic hollow body and inorganic reinforcing fiber if necessary, which are bonded to one another by an inorganic adhesive agent gives excellent electric wave absorbing power to the electric wave absorber. The electric wave absorbing molded body is given mechanical strength by the nonflammable layer. The nonflammable layer has a function of giving excellent nonflammable characteristic to the electric wave absorber. Further, by provision of an inorganic coating agent layer as the nonflammable layer, both surface void filling effect and mechanical strength are given to the electric wave absorber.

DETAILED DESCRIPTION OF THE PREFERRED EMBODIMENTS

Figure 1:
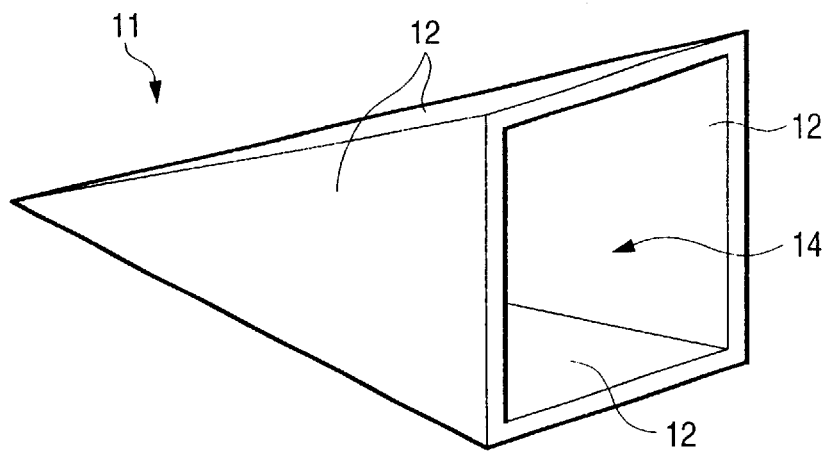
FIG. 1 is a perspective view showing an example of the structure of the electric wave absorber according to the present invention.

A first embodiment of the present invention will be described below.

The electric wave absorber 1 of the present invention is formed by bonding an electrically conductive member and a powdered or granulated material of an inorganic hollow body, and inorganic reinforcing fiber with each other by an inorganic adhesive agent. At least one member of the group consisting of carbon black, graphite, and carbon fiber can be used as the electrically conductive member.

Carbon black and/or graphite heretofore used as a lossy material for absorbing electric waves may be used as the electrically conductive member. The amount of carbon black and/or graphite contained in the electric wave absorber is in a range of from 10 to 80 g/l, preferably in a range of from 30 to 50 g/l. Further, carbon fiber used as the electrically conductive member is not limited specifically in terms of fiber length, density and shape. For example, carbon fiber having a fiber length of from about 3 to about 20 mm can be used. The amount of carbon fiber contained in the electric wave absorber is in a range of from 0.5 to 15 g/l, preferably in a range of from 1 to 10 g/l. If the amount of the electrically conductive member contained in the electric wave absorber is out of the aforementioned range, the electric wave absorber hardly exhibits sufficient electric wave absorbing power and the nonflammable characteristic of the electric wave absorber is lowered undesirably.

One member or a combination of two or more members of the group consisting of SHIRASU balloons, silica balloons, glass beads, and alumina-silica balloons, can be used as the powdered or granulated material of the inorganic hollow body. A material having a mean grain size in a range of from 5 to 1000 μm, preferably in a range of from 50 to 400 μm, is used as the powdered or granulated material of the inorganic hollow body. If the mean grain size of the inorganic hollow body is smaller than 5 μm, the loading density of the inorganic hollow body in the electric wave absorber becomes so high that the weight of the electric wave absorber increases undesirably. If the mean grain size of the inorganic hollow body is contrariwise larger than 1000 μm, the loading density of the inorganic hollow body in the electric wave absorber becomes so low that the amount of use of the inorganic adhesive agent higher in specific gravity increases to enhance the adhesive strength between grains. Also in this case, the weight of the electric wave absorber increases undesirably. In the present invention, the inorganic hollow body small in mean grain size as described above is used to make reduction of weight possible compared with the background-art case where an inorganic hollow body having a mean grain size in a range of from about 1.5 to about 4.5 mm is used.

Examples of the inorganic reinforcing fiber as one of constituent members of the electric wave absorber include glass fiber, rock wool fiber, stainless steel fiber, silica-alumina fiber, potassium titanate fiber, and so on. The amount of the inorganic reinforcing fiber which can be contained in the electric wave absorber is in a range of from 1 to 20 g/l. If the amount of the inorganic reinforcing fiber is smaller than 1 g/l, the mechanical strength of the electric wave absorber becomes insufficient. If the amount of the inorganic reinforcing fiber is larger than 20 g/l, the weight of the electric wave absorber increases undesirably.

An adhesive agent capable of being cured by hydration, such as Portland cement, gypsum, or the like, or an inorganic adhesive agent such as phosphoric acid salt, silica sol, a water-glass composition, or the like can be used as the inorganic adhesive agent. Especially, a water-glass composition which is inexpensive and high in cementing characteristic can be used preferably. Water-glass is an aqueous solution containing alkaline metal silicate as a main component. Especially, sodium silicate is preferable because it is inexpensive and easily available as an article standardized according to JIS. Further, a mixture of water-glass of sodium silicate and water-glass of lithium silicate may be used. The water-glass composition is prepared by mixing a curing agent with the aforementioned water-glass in order to shorten the curing time and improve both water resistance and heat resistance. Examples of the curing agent include: borates such as zinc borate, potassium borate, etc.; polyvalent metal oxides such as zinc oxide, etc.; polyvalent metal hydroxides such as calcium hydroxide, etc.; silicates such as calcium silicate, etc.; and so on. Especially, zinc borate is the best of these. When zinc borate is used as the curing agent, the curing time of the water-glass composition can be adjusted suitably within a range of from about 5 minutes to about 1 hour if 10 to 20 parts by weight of zinc borate are added to 100 parts by weight of water-glass.

The electric wave absorber according to the present invention can be formed by injecting a slurry containing the electrically conductive member, the inorganic hollow body, the inorganic reinforcing fiber, the inorganic adhesive agent and water into a predetermined-shaped mold. The electric wave absorber is very advantageous in terms of reduction of weight because the specific gravity of the electric wave absorber is small to be in a range of from about 0.20 to about 0.35 g/cm3. Further, the thickness of the electric wave absorber according to the present invention is preferably in a range of from about 10 to about 30 mm.

The electric wave absorber according to the present invention may be provided with a nonflammable layer integrally bonded to at least one portion of the electric wave absorber. The nonflammable layer is any one of a nonflammable layer constituted by a nonflammable sheet made from a slurry containing sepiolite as a main component, a nonflammable layer constituted by an inorganic coating agent layer, and a nonflammable layer constituted by a laminate formed by laminating the inorganic coating agent layer on at least one portion of the nonflammable sheet. Since the electric wave absorber according to the present invention contains inorganic reinforcing fiber, the electric wave absorber is large in mechanical strength in spite of low specific gravity and light weight so that there is no fear that dust is generated by dropout of the inorganic hollow body or the electrically conductive member upon collision. When the nonflammable layer is used so as to cover the electric wave absorber, not only mechanical strength is enhanced more greatly but also nonflammable characteristic is enhanced.

For example, the slurry for making the nonflammable sheet used as the nonflammable layer 3 contains 60 to 90% by weight of sepiolite and further contains a binder. The slurry may further contain glass fiber as a reinforcing material. The binder used may contain a thermoplastic resin for enhancing the strength of the nonflammable sheet, and a thermosetting resin having a network three-dimensional structure for giving both cohesive characteristic and water resistance. As the thermoplastic resin, an anionic thermoplastic resin such as polyacrylamide (molecular weight: about 800000 to about 1000000), or the like, may be used. As the thermosetting resin, a cationic thermosetting resin such as polyamide-polyamine-epichlorhydrine, or the like, may be used.

When a sheet formed from the aforementioned slurry by a paper-making process is dried at a predetermined temperature, the sheet is solidified with the advance of both vaporization of water and reaction of the binder. Thus, a nonflammable sheet is obtained. Alternatively, a laminate formed by sandwiching inorganic fiber by two sheets formed by a paper-making process may be dried at a predetermined temperature so as to be provided as a nonflammable sheet. The thickness of such a nonflammable sheet is preferably in a range of from about 0.1 to about 0.5 mm.

Incidentally, the inorganic fiber is glass fiber, carbon fiber, or the like, and its fiber thickness, density and shape are not limited specifically.

The inorganic coating agent used in the nonflammable layer is not limited specifically but a material heretofore used an inorganic coating agent having nonflammable or flame-resisting characteristic can be used. For example, the inorganic coating agent may be an inorganic coating agent containing alkyl silicate as a main agent, water for hydrolyzing the alkyl silicate, aluminum chelate as a reaction catalyst for accelerating the hydrolyzing reaction, methyl acid-phosphate as a reaction decelerator for decelerating the hydrolyzing reaction, and alcohol as a solvent for dissolving the alkyl silicate and water. The inorganic coating agent may further contain sepiolite dispersed in alcohol as the aforementioned solvent, and further contain carbon graphite, etc.

Examples of the alkyl silicate used include methyl trimethoxysilane, phenyl trimethoxysilane, etc. Further, a water type inorganic coating agent may be used. The thickness of the inorganic coating agent layer formed from the aforementioned inorganic coating agent is preferably in a range of from about 10 to about 30 $\mu$m.

The integral bonding of the nonflammable layer onto the electric wave absorber is performed by: (1) a method in which the nonflammable sheet or the nonflammable sheet provided with the inorganic coating agent layer by applying and curing the inorganic coating agent in advance is bonded to the electric wave absorber by the inorganic adhesive agent so that the nonflammable layer is integrally bonded onto the electric wave absorber; (2) a method in which the inorganic coating agent is applied on the electric wave absorber and cured so that the nonflammable layer made from the inorganic coating agent layer is integrally bonded onto the electric wave absorber; (3) a method in which the nonflammable sheet or the nonflammable sheet provided with the inorganic coating agent layer by applying and curing the inorganic coating agent in advance is disposed on an inner surface of the mold prepared for the slurry to be injected therein to mold the electric wave absorber so that both the electric wave absorber and the nonflammable layer are taken out of the mold simultaneously after the slurry is injected; or the like.

Incidentally, the nonflammable layer is integrally bonded to at least one portion of the electric wave absorber to improve the mechanical strength of the electric wave absorber more greatly. That is, it is not essential that nonflammable layers are provided on opposite sides of the electric wave absorber respectively.

Figure 2:
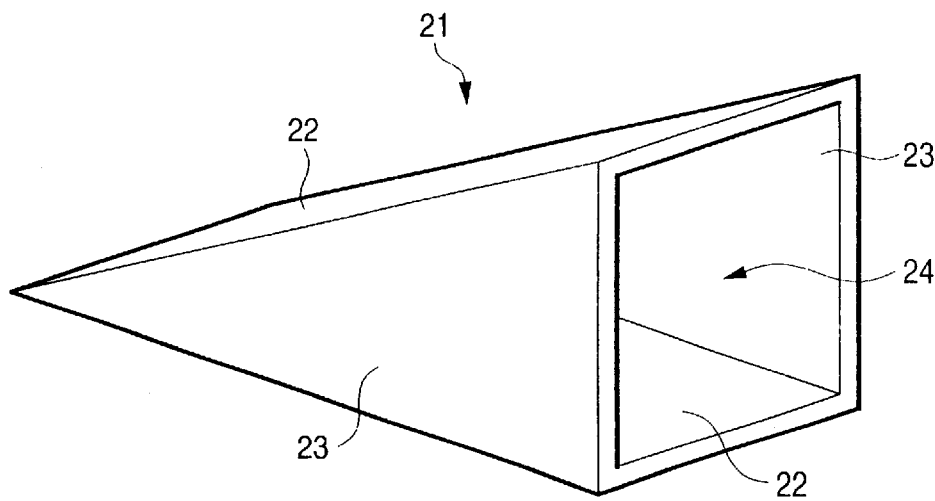
FIG. 2 is a perspective view showing another example of the structure of the electric wave absorber according to the present invention.
Figure 3:
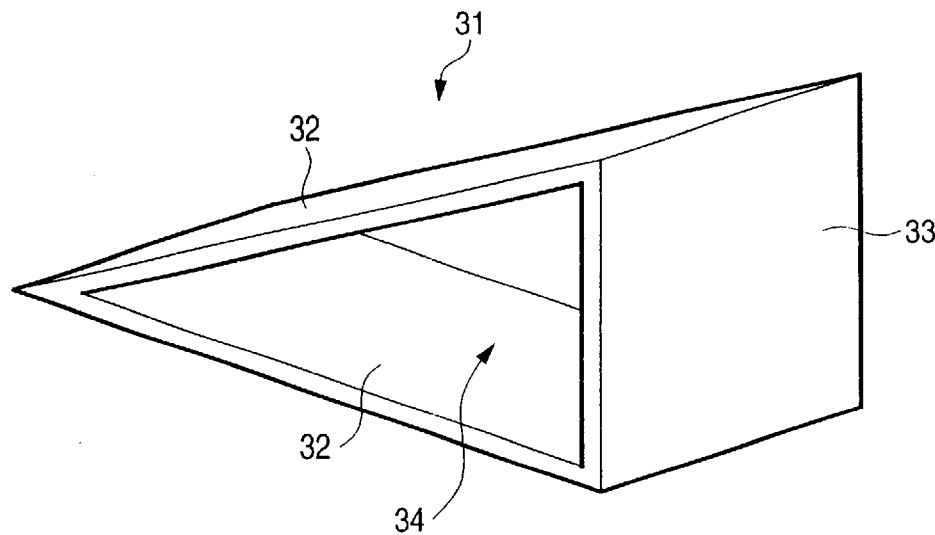
FIG. 3 is a perspective view showing a further example of the structure of the electric wave absorber according to the present invention.

FIGS. 1 through 3 are perspective views showing preferred examples of the structure of the electric wave absorber according to the present invention. The electric wave absorber 11 shown in FIG. 1 is provided as a quadrangular pyramid-shaped structure. The electric wave absorber 11 has isosceles triangle-shaped side wall portions 12, and an opening 14 provided in its base portion while its inside is provided as a hollow structure in order to reduce its weight. Such an electric wave absorber 11 can be produced by: a method in which plate-like electric wave absorbers according to the present invention are bonded to one another by an inorganic adhesive agent to thereby form a quadrangular pyramid shape; a method in which quadrangular pyramid-shaped female and male molds are prepared so that a slurry for an electric wave absorber is injected in a gap portion between the two molds, dried to be solidified and then taken out of the molds; or the like. Further, when the aforementioned nonflammable layer is to be provided the electric wave absorber 11, nonflammable layers are preferably integrally bonded to at least exposed surfaces (surfaces of the four side wall portions 12) of the electric wave absorbers. The electric wave absorber 11 having such nonflammable layers can be produced by: a method in which plate-like electric wave absorbers each having a nonflammable layer integrally bonded to at least one side of the electric wave absorber according to the present invention are bonded to one another by an inorganic adhesive agent with the nonflammable layer turning outward to thereby form a quadrangular pyramid shape; a method in which quadrangular pyramid-shaped female and male molds are prepared, a nonflammable layer (in this case, a nonflammable sheet or a nonflammable sheet provided with an inorganic coating agent layer by applying and curing an inorganic coating agent in advance) is disposed in the inside of the female mold in advance, a slurry for an electric wave absorber is injected in a gap portion between the two molds and dried to be solidified and then the electric wave absorber having nonflammable layers integrally bonded thereto is taken out of the molds; or the like.

Further, the electric wave absorber 21 shown in FIG. 2 is provided as a wedge-shaped structure. The electric wave absorber 21 has inclined portions 22, side wall portions 23 located between the inclined portions, and an opening 24 which is provided in its base portion while its inside is provided as a hollow structure in order to reduce its weight. Such an electric wave absorber 21 can be produced by: a method in which plate-like electric wave absorbers according to the present invention are bonded to one another by an inorganic adhesive agent to thereby form a wedge shape; a method in which wedge-shaped female and male molds are prepared so that a slurry for an electric wave absorber is injected in a gap portion between the molds, dried to be solidified and taken out of the molds; or the like. Further, when the aforementioned nonflammable layer is to be provided to the electric wave absorber 21, nonflammable layers are preferably integrally bonded to at least exposed surfaces (respective surfaces of the inclined portions 22 and of the side wall portions 23) of the electric wave absorber. The electric wave absorber 21 having such nonflammable layers can be produced by: a method in which plate-like electric wave absorbers each having a nonflammable layer integrally bonded to at least one side of the electric wave absorber according to the present invention are bonded to one another by an inorganic adhesive agent with the nonflammable layer turning outward to thereby form a wedge shape; a method in which wedge-shaped female and male molds are prepared, a nonflammable layer (in this case, a nonflammable sheet or a nonflammable sheet provided with an inorganic coating agent layer by applying and curing an inorganic coating agent in advance) is disposed in the inside of the female mold in advance, a slurry for an electric wave absorbing molded body is injected in a gap portion between the two molds and dried to be solidified and then the electric wave absorbing molded body having nonflammable layers integrally bonded thereto is taken out of the molds; or the like.

Further, the electric wave absorber 31 shown in FIG. 3 is provided as a wedge-shaped structure. The electric wave absorber 31 has inclined portions 32, a base portion 33 located in the base of the inclined portions, and openings 34 which are provided between the inclined portions while its inside is provided as a hollow structure in order to reduce its weight. Such an electric wave absorber 31 can be produced by: a method in which plate-like electric wave absorbers according to the present invention are bonded to one another by an inorganic adhesive agent to thereby form a wedge shape; or the like. Further, when the aforementioned nonflammable layer is to provided to the electric wave absorber 31, nonflammable layers are preferably integrally bonded to at least exposed surfaces (surfaces of the inclined portions 32) of the electric wave absorber. The electric wave absorber 31 having such nonflammable layers can be produced by: a method in which plate-like electric wave absorbers each having a nonflammable layer integrally bonded to at least one side of the electric wave absorber according to the present invention are bonded to one another by an inorganic adhesive agent with the nonflammable layer turning outward to thereby form a wedge shape; or the like.

[Examples]

The present invention will be described more in detail below in connection with specific examples thereof.

(Example A1)

First, a slurry of the following composition for an electric wave absorbing molded body was prepared by use of a Henschel mixer.

Composition of Slurry for Electric Wave Absorbing Molded Body

SHIRASU balloon (mean grain size: 50 to 400 μm) (SANKILITE made by Sanki Engineering Co., Ltd.)
220 parts by weight
graphite (blue-P made by Nippon Graphite Industries, Ltd.)
50 parts by weight
glass fiber (6 mm-article made by Nitto Boseki Co., Ltd.)
8 parts by weight
inorganic adhesive agent (FJ294 made by Tokiwa Electric Co.)
175 parts by weight water 550 parts by weight Then, the aforementioned slurry was injected in a mold. The slurry was dried at 60° C. for 24 hours so that a plate-like electric wave absorber having a size 650 mm×1400 mm×15 mm and having a sectional structure shown in FIG. 1 was produced. Then, the electric wave absorber was dried at 60° C. for 7 days. The specific gravity of the electric wave absorber was 0.31 g/cm3. The amount of the electrically conductive member (graphite) contained in the electric wave absorbing molded body was 40 g/l. Further, both nonflammable characteristic and mechanical strength were measured by the following measurement method and shown in the following Table 1.

Nonflammable Characteristic Test

According to the nonflammable material testing method provided in Notification No. 1828 of the Ministry of Construction in Japan, first, electric wave absorbers were laminated by use of an inorganic adhesive agent (FJ294 made by Tokiwa Electric Co.) so that a test piece having a size 40 mm×40 mm×50 mm. The test piece was heated in a furnace at a temperature of 750±10° C. for 20 minutes. The rise of the temperature of the test piece due to the heating was measured. When the rise of the temperature of the test piece due to the heating was smaller than 50° C., the test piece passed in the nonflammable characteristic test.

Measurement of Mechanical Strength

According to JIS A1408, a test piece being 200 mm long, 150 mm wide and 15 mm thick (or 16 mm thick in the case where a nonflammable sheet of paper was provided) was produced. After the test piece was left in an air-dried state, the bending strength of the test piece was measured at a pressing rate of 1 mm/min.

Then, two sheets of trapezoidal electric wave absorbers each for an inclined portion having an upper base 400 mm long and a lower base 600 mm long and being 1330 mm high and two sheets of isosceles triangle-shaped electric wave absorbers each for a side wall having a base 600 mm long and being 1300 mm high were produced by use of the aforementioned plate-like electric wave absorber. A wedge-shaped electric wave absorber having a base 600 mm×600 mm and being 1300 mm high as shown in FIG. 2 was produced from the four sheets of electric wave absorbers by use of an inorganic adhesive agent (FJ294 made by Tokiwa Electric Co.). Ferrite IB-011 (5.9 mm thick) made by TDK Corp. and having a shield panel disposed on its back was attached to the rear side of the base of the electric wave absorber. The electric wave absorbing power of the electric wave absorber was measured at 1 GHz. That is, an electric wave was radiated onto the electric wave absorber in an electric wave dark room shown in the measurement system block diagram of FIG. 5 and the reflection wave level of the electric wave absorber was measured. The reflectivity (dB) of the electric wave absorber was calculated on the basis of the following expression with reference to the reflection level of only a metal plate having the same size (600 mm×600 mm) as the base of the electric wave absorber. Results were shown in the following Table 1.

Reflectivity (dB)=

Reflection Level of Electric Wave Absorber (dB)−

Reflection Level of Metal Plate (dB)

(Example A2)

First, a wedge-shaped female mold having a base 600 mm×600 mm and an upper base 400 mm long and being 1300 mm high and a male mold corresponding to the female mold were produced so that a gap portion between the two molds was 15 mm thick.

Then, a releasant was applied on inner surfaces of the molds. Then, a slurry of the same composition as that used for production in Embodiment 1 was injected in the gap portion between the two molds. The slurry was dried at 60° C. for 24 hours so that a wedge-shaped electric wave absorber having a base 600 mm×600 mm and being 1300 mm high was produced as shown in FIG. 3. Then, the electric wave absorber was dried at 60° C. for 7 days. The electric wave absorber had nonflammable layers of nonflammable sheets integrally bonded to exposed surfaces of a wedge-shaped structure. Further, the specific gravity of the electric wave absorber was 0.30 g/cm3. The amount of the electrically conductive member (graphite) contained in the electric wave absorbing molded body was 40 g/l.

The nonflammable characteristic, mechanical strength and 1 GHz-electric wave absorbing power of the electric wave absorber were measured by the same measurement method as in Embodiment 1 and shown in the following Table 1.

(Example A3)

A slurry of the following composition for an electric wave absorbing molded body was prepared by use of Omni-mixer.
Composition of Slurry for Electric Wave Absorbing Molded Body SHIRASU balloon (mean grain size: 50 to 400 μm)
(SANKILITE made by Sanki Engineering Co., Ltd.)
220 parts by weight
carbon fiber (DIALEAD made by Mitsubishi Chemical Corp.)
(fiber length=10 mm)
6 parts by weight
glass fiber (6 mm-article made by Nitto Boseki Co., Ltd.)
60 parts by weight
inorganic adhesive agent (FJ294 made by Tokiwa Electric Co.)
160 parts by weight
water 500 parts by weight A wedge-shaped electric wave absorber having a base 600 mm×600 mm and being 1300 mm high as shown in FIG. 3 was produced by use of the slurry in the same manner as in Embodiment 2. Then, the electric wave absorber was dried at 60° C. for 7 days. The electric wave absorber had a wedge-shaped structure. Further, the specific gravity of the electric wave absorber was 0.25 g/cm3. The amount of the electrically conductive member (carbon fiber) contained in the electric wave absorbing molded body was 5 g/l.

The nonflammable characteristic, mechanical strength and 1 GHz-electric wave absorbing power of the electric wave absorber were measured by the same measurement method as in Embodiment 1 and shown in the following Table 1.

(Example A4)

A plate-like electric wave absorber was produced in the same manner as in Embodiment 1 except that the amount of graphite (blue-P made by Nippon Graphite Industries, Ltd.) in the slurry for an electric wave absorbing molded body was adjusted so that the amount of the electrically conductive member (graphite) contained in the electric wave absorbing molded body was 30 g/l. A wedge-shaped structure was further produced by use of the plate-like electric wave absorbers. The specific gravity of the electric wave absorber was 0.28 g/cm3. The nonflammable characteristic, mechanical strength and 1 GHz-electric wave absorbing power of the electric wave absorber were measured by the same measurement method as in Embodiment 1 and shown in the following Table 1.

(Example A5)

A plate-like electric wave absorber was produced in the same manner as in Embodiment 1 except that the amount of graphite (blue-P made by Nippon Graphite Industries, Ltd.) in the slurry for an electric wave absorbing molded body was adjusted so that the amount of the electrically conductive member (graphite) contained in the electric wave absorbing molded body was 50 g/l. A wedge-shaped structure was further produced by use of the plate-like electric wave absorbers. The specific gravity of the electric wave absorber was 0.32 g/cm3. The nonflammable characteristic, mechanical strength and 1 GHz-electric wave absorbing power of the electric wave absorber were measured by the same measurement method as in Embodiment 1 and shown in the following Table 1.

(Example 6)

A wedge-shaped electric wave absorber was produced in the same manner as in Embodiment 3 except that the amount of carbon fiber (DIALEAD made by Mitsubishi Chemical Corp.) in the slurry for an electric wave absorbing molded body was adjusted so that the amount of the electrically conductive member (carbon fiber) contained in the electric wave absorbing molded body was 0.5 g/l.

The specific gravity of the electric wave absorber was 0.25 g/cm3. The nonflammable characteristic, mechanical strength and 1 GHz-electric wave absorbing power of the electric wave absorber were measured by the same measurement method as in Embodiment 1 and shown in the following Table 1.

(Example 7)

A wedge-shaped electric wave absorber was produced in the same manner as in Embodiment 3 except that the amount of carbon fiber (DIALEAD made by Mitsubishi Chemical Corp.) in the slurry for an electric wave absorbing molded body was adjusted so that the amount of the electrically conductive member (carbon fiber) contained in the electric wave absorbing molded body was 15 g/l. The specific gravity of the electric wave absorber was 0.28 g/cm3. The nonflammable characteristic, mechanical strength and 1 GHz-electric wave absorbing power of the electric wave absorber were measured by the same measurement method as in Embodiment 1 and shown in the following Table 1.

(Example 8)

A nonflammable sheet (GP19 (0.27 mm thick) made by Tokiwa Electric Co.) to form a nonflammable layer was disposed in the inside of a mold in advance. A plate-like electric wave absorber having nonflammable sheets integrally provided on its opposite sides respectively and having a size 650 mm×1400 mm×15 mm was produced by injecting a slurry of the same composition as that used for production in Embodiment 1 into the mold and then drying the slurry at 60° C. for 24 hours. Then, a wedge-shaped structure was produced in the same manner as in Example 1 by use of the plate-like electric wave absorbers. The specific gravity of the electric wave absorber was 0.28 g/cm3. The amount of the electrically conductive member (graphite) contained in the electric wave absorber was 40 g/l. Further, the nonflammable characteristic, mechanical strength and 1 GHz-electric wave absorbing power of the electric wave absorber were measured by the same measurement method as in Embodiment 1 and shown in the following Table 1.
(Comparative Example)

First, a slurry of the following composition for an electric wave absorber was prepared by use of a Henschel mixer.
Composition of Slurry for Electric Wave Absorber
SHIRASU balloon (mean grain size: 50 to 400 μm)
(SANKILITE made by Sanki Engineering Co., Ltd.)
220 parts by weight
graphite (blue-P made by Nippon Graphite Industries, Ltd.)
50 parts by weight
inorganic adhesive agent (FJ294 made by Tokiwa Electric Co.)
175 parts by weight
water 550 parts by weight Then, the aforementioned slurry was injected in a mold and dried at 60° C. for 24 hours to thereby produce a plate-like electric wave absorber having a size 650 mm×1400 mm×15 mm. Then, the electric wave absorber was dried at 60° C. for 7 days.

The specific gravity of the electric wave absorber was 0.31 g/cm3. The amount of the electrically conductive member (graphite) contained in the electric wave absorber was 40 g/l. Further, the nonflammable characteristic and mechanical strength of the electric wave absorber were measured by the same measurement method as in Embodiment 1 and shown in the following Table 1.

Then, a wedge-shaped electric wave absorber having a base 600 mm×600 mm and being 1300 mm high as shown in FIG. 2 was produced by use of the aforementioned plate-like electric wave absorber in the same manner as in Example 1. The electric wave absorbing power of the electric wave absorber was measured at 1 GHz by the same measurement method as in Example 1. Results were shown in the following Table 1.

TABLE 1

| Electric Wave Absorber | Specific Gravity (g/cm3) | Nonflammable Characteristic | Strength (kgf cm2) | Mechanical Reflectivity (dB) |
|---|---|---|---|---|
| Example A1 | 0.31 | Good (763° C.) | 2.7 | −23 |
| Example A2 | 0.30 | Good (761° C.) | 2.5 | −23 |
| Example A3 | 0.25 | Good (766° C.) | 3.5 | −28 |
| Example A4 | 0.28 | Good (765° C.) | 2.7 | −21 |
| Example A5 | 0.32 | Good (767° C.) | 3.0 | −25 |
| Example A6 | 0.25 | Good (760° C.) | 4.0 | −21 |
| Example A7 | 0.28 | Good (767° C.) | 3.8 | −22 |
| Example A8 | 0.28 | Good (762° C.) | 4.2 | −26 |
| Comparative Example | 0.31 | Good (765° C.) | 0.4 | −23 |

*: The temperature of a test piece due to heating was shown in parentheses on the column for evaluation of nonflammable characteristic.

As shown in Table 1, it was confirmed that the electric wave absorbers in Embodiments 1 to 8 were low in specific gravity, light in weight and excellent in nonflammable characteristic, mechanical strength and electric wave absorbing power. It was further confirmed that the mechanical strength was enhanced more greatly when the nonflammable layer was integrally bonded to the electrical wave absorber (Example 8).

On the contrary, the electric wave absorber without provision of any inorganic reinforcing fiber in Comparative Example was small in mechanical strength so that it was unable to be put to practical use.

As described above in detail, according to the present invention, the electric wave absorber exhibits excellent electric wave absorbing power because of both the electrically conductive member and the powdered or granulated material of the inorganic hollow body which are contained in the electric wave absorber. Further, the electric wave absorber has excellent mechanical strength because of the inorganic reinforcing fiber which is contained in the electric wave absorber. Further, the electric wave absorber has excellent nonflammable characteristic because of both the powdered or granulated material of the inorganic hollow body and the inorganic reinforcing fiber which are contained in the electric wave absorber. Accordingly, not only the electric wave absorber is excellent in electric wave absorbing power, wide in electric wave absorption frequency band and high in withstanding electric power but also the electric wave absorber is light in weight, and excellent both in mechanical strength and in nonflammable characteristic. Accordingly, not only safety in work environment can be enhanced but also reduction of production cost can be achieved.

A second embodiment of the present invention will be described below.

Figure 5:
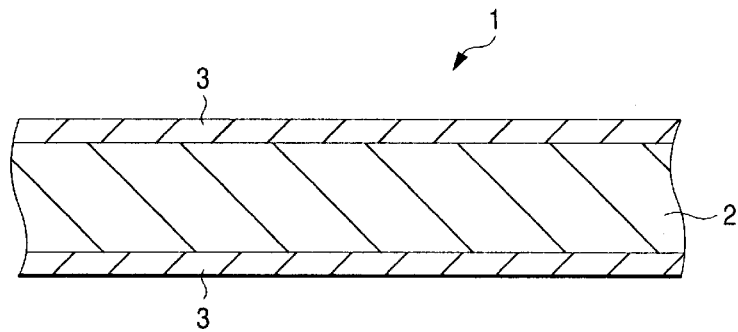
FIG. 5 is a schematic sectional view showing another embodiment of the electric wave absorber according to the present invention.

FIG. 5 is a schematic sectional view showing an embodiment of the electric wave absorber according to the present invention. In FIG. 5, the electric wave absorber 1 has an electric wave absorbing molded body 2, and nonflammable layers 3 which are integrally bonded to opposite sides of the electric wave absorbing molded body.

The electric wave absorbing molded body 2 which is one of constituent members of the electric wave absorber 1, is formed by bonding an electrically conductive member and a powdered or granulated material of an inorganic hollow body with each other by an inorganic adhesive agent or by bonding an electrically conductive member, a powdered or granulated material of an inorganic hollow body and inorganic reinforcing fiber to one another by an inorganic adhesive agent. At least one member of the group consisting of carbon black, graphite, and carbon fiber can be used as the electrically conductive member.

Carbon black and/or graphite heretofore used as a lossy material for absorbing electric waves may be used as the electrically conductive member. The amount of carbon black and/or graphite contained in the electric wave absorbing molded body 2 is in a range of from 10 to 80 g/l, preferably in a range of from 30 to 50 g/l. Further, carbon fiber used as the electrically conductive member is not limited specifically in terms of fiber length, density and shape. For example, carbon fiber having a fiber length of from about 3 to about 20 mm can be used. The amount of carbon fiber contained in the electric wave absorbing molded body 2 is in a range of from 0.5 to 15 g/l, preferably in a range of from 1 to 10 g/l. If the amount of the electrically conductive member contained in the electric wave absorbing molded body 2 is out of the aforementioned range, the electric wave absorbing molded body 2 hardly exhibits sufficient electric wave absorbing power and the nonflammable characteristic of the electric wave absorbing molded body 2 is lowered undesirably.

One member or a combination of two or more members of the group consisting of SHIRASU balloons, silica balloons, glass beads, and alumina-silica balloons, can be used as the powdered or granulated material of the inorganic hollow body. A material having a mean grain size in a range of from 5 to 1000 μm, preferably in a range of from 50 to 400 μm, is used as the powdered or granulated material of the inorganic hollow body. If the mean grain size of the inorganic hollow body is smaller than 5 μm, the loading density of the inorganic hollow body in the electric wave absorbing molded body 2 becomes so high that the weight of the electric wave absorber 1 increases undesirably. If the mean grain size of the inorganic hollow body is contrariwise larger than 1000 μm, the loading density of the inorganic hollow body in the electric wave absorbing molded body 2 becomes so low that the amount of use of the inorganic adhesive agent higher in specific gravity increases to enhance the adhesive strength between grains. Also in this case, the weight of the electric wave absorber 1 increases undesirably. In the present invention, the inorganic hollow body small in mean grain size as described above is used to make reduction of weight possible compared with the background-art case where an inorganic hollow body having a mean grain size in a range of from about 1.5 to about 4.5 mm is used.

An adhesive agent capable of being cured by hydration, such as Portland cement, gypsum, or the like, or an inorganic adhesive agent such as phosphoric acid salt, silica sol, a water-glass composition, or the like can be used as the inorganic adhesive agent. Especially, a water-glass composition which is inexpensive and high in cementing characteristic can be used preferably. Water-glass is an aqueous solution containing alkaline metal silicate as a main component. Especially, sodium silicate is preferable because it is inexpensive and easily available as an article standardized according to JIS. Further, a mixture of water-glass of sodium silicate and water-glass of lithium silicate may be used. The water-glass composition is prepared by mixing a curing agent with the aforementioned water-glass in order to shorten the curing time and improve both water resistance and heat resistance. Examples of the curing agent include: borates such as zinc borate, potassium borate, etc.; polyvalent metal oxides such as zinc oxide, etc.; polyvalent metal hydroxides such as calcium hydroxide, etc.; silicates such as calcium silicate, etc.; and so on. Especially, zinc borate is the best of these. When zinc borate is used as the curing agent, the curing time of the water-glass composition can be adjusted suitably within a range of from about 5 minutes to about 1 hour if 10 to 20 parts by weight of zinc borate are added to 100 parts by weight of water-glass.

When the electric wave absorbing molded body 2 as one of constituent members of the electric wave absorber 1 is made to contain inorganic reinforcing fiber as a reinforcing material in addition to the powdered or granulated material of the inorganic hollow body, examples of the inorganic reinforcing fiber used include glass fiber, rock wool fiber, stainless steel fiber, silica-alumina fiber, potassium titanate fiber, and so on. The amount of the inorganic reinforcing fiber which can be contained in the electric wave absorbing molded body 2, is in range of from 1 to 20 g/l.

The aforementioned electric wave absorbing molded body 2 can be formed by injecting a slurry containing the electrically conductive member, the inorganic hollow body, (the inorganic reinforcing fiber if necessary), the inorganic adhesive agent and water into a predetermined-shape mold. The electric wave absorbing molded body 2 is very advantageous in terms of reduction of the weight of the electric wave absorber 1 because the specific gravity of the electric wave absorbing molded body 2 is small to be in a range of from about 0.20 to about 0.35 g/cm3.

The nonflammable layer 3 as one of constituent members of the electric wave absorber 1 according to the present invention is any one of a nonflammable layer constituted by a nonflammable sheet made from a slurry containing sepiolite as a main component, a nonflammable layer constituted by an inorganic coating agent layer, and a nonflammable layer constituted by a laminate formed by laminating the inorganic coating agent layer on at least one portion of the nonflammable sheet. When the electric wave absorbing molded body 2 contains no inorganic reinforcing fiber, it is small in mechanical strength in spite of low specific gravity and light weight so that dust may be generated upon collision because the inorganic hollow body or the electrically conductive member drops out. The nonflammable layer 3 is disposed so as to cover the electric wave absorbing molded body 2 for giving mechanical strength and for giving nonflammable characteristic.

For example, the slurry for making the nonflammable sheet used as the nonflammable layer 3 contains 60 to 90% by weight of sepiolite and further contains a binder. The slurry may further contain glass fiber as a reinforcing material. The binder used may contain a thermoplastic resin for enhancing the strength of the nonflammable sheet, and a thermosetting resin having a network three-dimensional structure for giving both cohesive characteristic and water resistance. As the thermoplaesticresin, an anionic thermoplastic resin such as polyacrylamide (molecular weight: about 800000 to about 1000000), or the like, may be used. As the thermosetting resin, a cationic thermosetting resin such as polyamide-polyamine-epichlorhydrine, or the like, may be used.

When a sheet formed from the aforementioned slurry by a paper-making process is dried at a predetermined temperature, the sheet is solidified with the advance of both vaporization of water and reaction of the binder. Thus, a nonflammable sheet is obtained. Alternatively, a laminate formed by sandwiching inorganic fiber by two sheets formed by a paper-making process may be dried at a predetermined temperature so as to be provided as a nonflammable sheet. The thickness of such a nonflammable sheet is preferably in a range of from about 0.1 to about 0.5 mm. Incidentally, the inorganic fiber is glass fiber, carbon fiber, or the like, and its fiber thickness, density and shape are not limited specifically.

The inorganic coating agent used in the nonflammable layer 3 is not limited specifically but a material heretofore used as an inorganic coating agent having nonflammable or flame-resisting characteristic can be used. For example, the inorganic coating agent may be an inorganic coating agent containing alkyl silicate as a main agent, water for hydrolyzing the alkyl silicate, aluminum chelate as a reaction catalyst for accelerating the hydrolyzing reaction, methyl acid-phosphate as a reaction decelerator for decelerating the hydrolyzing reaction, and alcohol as a solvent for dissolving the alkyl silicate and water. The inorganic coating agent may further contain sepiolite dispersed in alcohol as the aforementioned solvent, and further contain carbon graphite, etc. Examples of the alkyl silicate used include methyl trimethoxysilane, phenyl trimethoxysilane, etc. Further, a water type inorganic coating agent may be used. The thickness of the inorganic coating agent layer formed from the aforementioned inorganic coating agent is preferably in a range of from about 10 to about 30 μm.

The integral bonding of the nonflammable layer 3 onto the electric wave absorbing molded body 2 is performed by: (1)

a method in which the nonflammable sheet or the nonflammable sheet provided with the inorganic coating agent layer by applying and curing the inorganic coating agent in advance is bonded to the electric wave absorbing molded body 2 by the inorganic adhesive agent so that the nonflammable layer 3 is integrally bonded onto the electric wave absorbing molded body 2; (2) a method in which the inorganic coating agent is applied on the electric wave absorbing molded body 2 and cured so that the nonflammable layer 3 made from the inorganic coating agent layer is integrally bonded onto the electric wave absorbing molded body 2; (3) a method in which the nonflammable sheet or the nonflammable sheet provided with the inorganic coating agent layer by applying and curing the inorganic coating agent in advance is disposed on an inner surface of the mold prepared for the slurry to be injected therein to mold the electric wave absorbing molded body 2 so that both the electric wave absorbing molded body 2 and the nonflammable layer 3 are taken out of the mold simultaneously after the slurry is injected; or the like.

The thickness of the plate-like electric wave absorber 1 shown in FIG. 5 is preferably in a range of from about 10 to about 30 mm. Further, the nonflammable layer 3 is integrally bonded to at least one portion of the electric wave absorbing molded body 2 to improve the mechanical strength of the electric wave absorbing molded body 2. That is, it is not essential that nonflammable layers are provided on opposite sides of the electric wave absorbing molded body 2 respectively as shown in FIG. 5.

FIGS. 1 through 3 are perspective views showing preferred examples of the structure of the electric wave absorber according to the present invention. The electric wave absorber 11 shown in FIG. 1 is provided as a quadrangular pyramid-shaped structure. The electric wave absorber 11 has isosceles triangle-shaped side wall portions 12, and an opening 14 provided in its base portion while its inside is provided as a hollow structure in order to reduce its weight. In the quadrangular pyramid-shaped electric wave absorber 11, nonflammable layers are integrally bonded to at least exposed surfaces (surfaces of the four side wall portions 12). Such an electric wave absorber can be produced by: a method in which plate-like electric wave absorbers each having a nonflammable layer integrally bonded to at least one side of the side wall portion according to the present invention are bonded to one another by an inorganic adhesive agent with the nonflammable layer turning outward so as to form a quadrangular pyramid shape; a method in which quadrangular pyramid-shaped female and male molds are prepared, a nonflammable layer (in this case, a nonflammable sheet or a nonflammable sheet provided with an inorganic coating agent layer by applying and curing an inorganic coating agent in advance) is disposed in the inside of the female mold in advance, a slurry for an electric wave absorbing molded body is injected in a gap portion between the two molds and dried to be solidified and then the electric wave absorbing molded body integrally bonded to the nonflammable layer is taken out of the molds; or the like.

Further, the electric wave absorber 21 shown in FIG. 2 is provided as a wedge-shaped structure. The electric wave absorber 21 has inclined portions 22, side wall portions 23 located between the inclined portions, and an opening b 24 which is provided in its base portion while its inside is provided as a hollow structure in order to reduce its weight. In the wedge-shaped electric wave absorber 21, nonflammable layers are integrally bonded to at least exposed surfaces (respective surfaces of the inclined portions 22 and of the side wall portions 23). Such an electric wave absorber can be produced by: a method in which plate-like electric wave absorbers each having a nonflammable layer integrally bonded to at least one side of the inclined portion or the side wall portion according to the present invention are bonded to one another by an inorganic adhesive agent with the nonflammable layer turning outward so as to form a wedge; a method in which wedge-shaped female and male molds are prepared, a nonflammable layer (in this case, a nonflammable sheet or a nonflammable sheet provided with an inorganic coating agent layer by applying and curing an inorganic coating agent in advance) is disposed in the inside of the female mold in advance, a slurry for an electric wave absorbing molded body is injected in a gap portion between the two molds and dried to be solidified and then the electric wave absorbing molded body integrally bonded to the nonflammable layer is taken out of the molds; or the like.

Further, the electric wave absorber 31 shown in FIG. 3 is provided as a wedge-shaped structure. The electric wave absorber 31 has inclined portions 32, a base portion 33 located in the base of the inclined portions, and openings 34 which are provided between the inclined portions while its inside is provided as a hollow structure in order to reduce its weight. In the wedge-shaped electric wave absorber 31, nonflammable layers are integrally bonded to at least exposed surfaces (surfaces of the inclined portions 32). Such an electric wave absorber can be produced by: a method in which plate-like electric wave absorbers each having a nonflammable layer integrally bonded to at least one side surface according to the present invention are bonded to one another by an inorganic adhesive agent with the nonflammable layer turning outward so as to form a wedge shape; or the like.

[Examples]

The present invention will be described more in detail below in connection with specific examples thereof.

(Example B1)

First, a slurry of the following composition for an electric wave absorbing molded body was prepared by use of a Henschel mixer.

Composition of Slurry for Electric Wave Absorbing Molded Body

SHIRASU balloon (mean grain size: 50 to 400 $\mu$m) (SANKILITE made by Sanki Engineering Co., Ltd.)

220 parts by weight graphite (blue-P made by Nippon Graphite Industries, Ltd.)

50 parts by weight glass fiber (6 mm-article made by Nitto Boseki Co., Ltd.)

8 parts by weight inorganic adhesive agent (FJ294 made by Tokiwa Electric Co.)

175 parts by weight water 550 parts by weight

Then, the aforementioned slurry was injected in a mold in which a nonflammable sheet (GP19 (0.27 mm thick) made by Tokiwa Electric Co.) to form a nonflammable layer was disposed in the inside of the mold in advance. The slurry was dried at 60° C. for 24 hours so that a plate-like electric wave absorber having a size 650 mm×1400 mm×15 mm and having a sectional structure shown in FIG. 5 was produced. Then, the electric wave absorber was dried at 60° C. for 7 days. The specific gravity of the electric wave absorber was 0.32 g/cm3. The amount of the electrically conductive member (graphite) contained in the electric wave absorbing molded body was 40 g/l. Further, both nonflammable characteristic and mechanical strength were measured by the following measurement method and shown in the following Table 2.

Nonflammable Characteristic Test

According to the nonflammable material testing method provided in Notification No. 1828 of the Ministry of Construction in Japan, first, electric wave absorbers were laminated by use of an inorganic adhesive agent (FJ294 made by Tokiwa Electric Co.) so that a test piece having a size 40 mm×40 mm×50 mm. The test piece was heated in a furnace at a temperature of 750±10° C. for 20 minutes. The rise of the temperature of the test piece due to the heating was measured. When the rise of the temperature of the test piece due to the heating was smaller than 50° C., the test piece passed in the nonflammable characteristic test.

Measurement of Mechanical Strength

According to JIS A1408, a test piece being 200 mm long, 150 mm wide and 15 mm thick (or 16 mm thick in the case where a nonflammable sheet of paper was provided) was produced. After the test piece was left in an air-dried state, the bending strength of the test piece was measured at a pressing rate of 1 mm/min.

Figure 4:
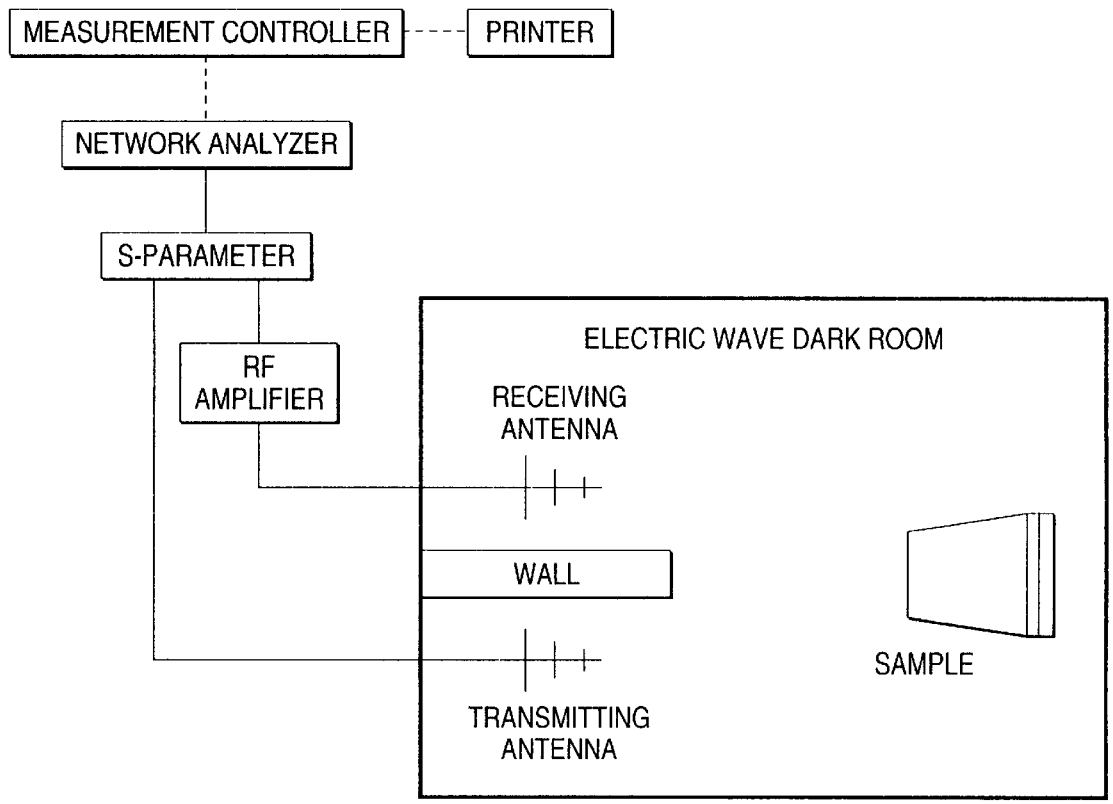
FIG. 4 is a block diagram of a measurement system for measuring the 1 GHz-electric wave absorbing power of the electric wave absorber in an embodiment.

Then, two sheets of trapezoidal electric wave absorbers each for an inclined portion having an upper base 400 mm long and a lower base 600 mm long and being 1330 mm high and two sheets of isosceles triangle-shaped electric wave absorbers each for a side wall having a base 600 mm long and being 1300 mm high were produced by use of the aforementioned plate-like electric wave absorber. A wedge-shaped electric wave absorber having a base 600 mm×600 mm and being 1300 mm high as shown in FIG. 1 was produced from the four sheets of electric wave absorbers by use of an inorganic adhesive agent (FJ294 made by Tokiwa Electric Co.). Ferrite IB-011 (5.9 mm thick) made by TDK Corp. and having a shield panel disposed on its back was attached to the rear side of the base of the electric wave absorber. The electric wave absorbing power of the electric wave absorber was measured at 1 GHz. That is, an electric wave was radiated onto the electric wave absorber in an electric wave dark room shown in the measurement system block diagram of FIG. 4 and the reflection wave level of the electric wave absorber was measured. The reflectivity (dB) of the electric wave absorber was calculated on the basis of the following expression with reference to the reflection level of only a metal plate having the same size (600 mm×600 mm) as the base of the electric wave absorber. Results were shown in the following Table 2.

Reflectivity (dB)=

Reflection Level of Electric Wave Absorber (dB)−

Reflection Level of Metal Plate (dB)

(Example B2)

First, a wedge-shaped female mold having a base 600 mm×600 mm and an upper base 400 mm long and being 1300 mm high and a male mold corresponding to the female mold were produced so that a gap portion between the two molds was 15 mm thick.

Then, a releasant was applied on inner surfaces of the molds. A nonflammable sheet (GP19 (0.27 mm thick) made by Tokiwa Electric) to form a nonflammable layer was disposed in the inside of the female mold in advance. Then, a slurry of the same composition as that used for production in Embodiment 1 was injected in the gap portion between the two molds. The slurry was dried at 60° C. for 24 hours so that a wedge-shaped electric wave absorber having a base 600 mm×600 mm and being 1300 mm high was produced as shown in FIG. 2. Then, the electric wave absorber was dried at 60° C. for 7 days. The electric wave absorber had nonflammable layers of nonflammable sheets integrally bonded to exposed surfaces of a wedge-shaped structure. Further, the specific gravity of the electric wave absorber was 0.31 g/cm3. The amount of the electrically conductive member (graphite) contained in the electric wave absorbing molded body was 40 g/l.

The nonflammable characteristic, mechanical strength and 1 GHz-electric wave absorbing power of the electric wave absorber were measured by the same measurement method as in Embodiment 1 and shown in the following Table 2.

(Example B3)

A slurry of the following composition for an electric wave absorbing molded body was prepared by use of Omni-mixer.

Composition of Slurry for Electric Wave Absorbing Molded Body

SHIRASU balloon (mean grain size: 50 to 400 μm)

(SANKILITE made by Sanki Engineering Co., Ltd.)

220 parts by weight carbon fiber (DIALEAD made by Mitsubishi Chemical Corp.)

(fiber length=10 mm)

6 parts by weight glass fiber (6 mm-article made by Nitto Boseki Co., Ltd.)

60 parts by weight inorganic adhesive agent (FJ294 made by Tokiwa Electric Co.)

160 parts by weight water 500 parts by weight

A wedge-shaped electric wave absorber having a base 600 mm×600 mm and being 1300 mm high as shown in FIG. 2 was produced by use of the slurry in the same manner as in Embodiment 2. Then, the electric wave absorber was dried at 60° C. for 7 days. The electric wave absorber had nonflammable layers of nonflammable sheets integrally bonded to exposed surfaces of a wedge-shaped structure. Further, the specific gravity of the electric wave absorber was 0.27 g/cm3. The amount of the electrically conductive member (carbon fiber) contained in the electric wave absorbing molded body was 5 g/l.

The nonflammable characteristic, mechanical strength and 1 GHz-electric wave absorbing power of the electric wave absorber were measured by the same measurement method as in Embodiment 1 and shown in the following Table 2.

(Example B4)

A plate-like electric wave absorber was produced in the same manner as in Embodiment 1 except that the amount of graphite (blue-P made by Nippon Graphite Industries, Ltd.) in the slurry for an electric wave absorbing molded body was adjusted so that the amount of the electrically conductive member (graphite) contained in the electric wave absorbing molded body was 30 g/l. A wedge-shaped structure was further produced by use of the plate-like electric wave absorbers. The specific gravity of the electric wave absorber was 0.30 g/cm3. The nonflammable characteristic, mechanical strength and 1 GHz-electric wave absorbing power of the electric wave absorber were measured by the same measurement method as in Embodiment 1 and shown in the following Table 2.

(Example B5)

A plate-like electric wave absorber was produced in the same manner as in Embodiment 1 except that the amount of graphite (blue-P made by Nippon Graphite Industries, Ltd.) in the slurry for an electric wave absorbing molded body was adjusted so that the amount of the electrically conductive member (graphite) contained in the electric wave absorbing molded body was 50 g/l. A wedge-shaped structure was further produced by use of the plate-like electric wave absorbers. The specific gravity of the electric wave absorber was 0.33 g/cm3. The nonflammable characteristic, mechanical strength and 1 GHz-electric wave absorbing power of the electric wave absorber were measured by the same measurement method as in Embodiment 1 and shown in the following Table 2.

(Example B6)

A wedge-shaped electric wave absorber was produced in the same manner as in Embodiment 3 except that the amount of carbon fiber (DIALEAD made by Mitsubishi Chemical Corp.) in the slurry for an electric wave absorbing molded body was adjusted so that the amount of the electrically conductive member (carbon fiber) contained in the electric wave absorbing molded body was 0.5 g/l. The specific gravity of the electric wave absorber was 0.26 g/cm3. The nonflammable characteristic, mechanical strength and 1 GHz-electric wave absorbing power of the electric wave absorber were measured by the same measurement method as in Embodiment 1 and shown in the following Table 2.

(Example B7)

A wedge-shaped electric wave absorber was produced in the same manner as in Embodiment 3 except that the amount of carbon fiber (DIALEAD made by Mitsubishi Chemical Corp.) in the slurry for an electric wave absorbing molded body was adjusted so that the amount of the electrically conductive member (carbon fiber) contained in the electric wave absorbing molded body was 15 g/l. The specific gravity of the electric wave absorber was 0.29 g/cm3. The nonflammable characteristic, mechanical strength and 1 GHz-electric wave absorbing power of the electric wave absorber were measured by the same measurement method as in Embodiment 1 and shown in the following Table 2.

(Example B8)

A wedge-shaped electric wave absorber was produced in the same manner as in Embodiment 3 except that a nonflammable sheet provided with a 20 μm-thick inorganic coating agent layer by applying an inorganic coating agent (GRANDEX FJ803 made by Tokiwa Electric Co.) onto a nonflammable sheet (GP19 (0.27 mm thick) made by Tokiwa Electric Co.) was used as a nonflammable sheet to form a nonflammable layer. The electric wave absorber was formed so that nonflammable layers each made from the nonflammable sheet coated with the inorganic coating agent layer were integrally bonded to exposed surfaces of a wedge-shaped structure. Further, the specific gravity of the electric wave absorber was 0.28 g/cm3. The amount of the electrically conductive member (carbon fiber) contained in the electric wave absorbing molded body was 5 g/l.

The nonflammable characteristic, mechanical strength and 1 GHz-electric wave absorbing power of the electric wave absorber were measured by the same measurement method as in Embodiment 1 and shown in the following Table 2.

(Example B9)

First, a wedge-shaped female mold having a base 600 mm×600 mm and an upper base 400 mm long and being 1300 mm high and a male mold corresponding to the female mold were produced so that a gap portion between the two molds was 15 mm thick.

Then, a releasant was applied on inner surfaces of the molds. A slurry of the same composition as that used for production in Embodiment 3 was injected in the gap portion between the two molds. The slurry was dried at 60° C. for 24 hours so that a wedge-shaped electric wave absorber having a base 600 mm×600 mm and being 1300 mm high as shown in FIG. 2 was produced. Then, an inorganic coating agent (GRANDEX FJ803 made by Tokiwa Electric Co.) was applied onto exposed surfaces of the electric wave absorber to provide an inorganic coating agent layer 20 μm thick. The electric wave absorber was dried at 60° C. for 7 days. The electric wave absorber was formed so that nonflammable layers each made from an inorganic coating agent layer were integrally bonded to exposed surfaces of a wedge-shaped structure. Further, the specific gravity of the electric wave absorber was 0.30 g/cm3. The amount of the electrically conductive member (carbon fiber) contained in the electric wave absorbing molded body was 5 g/l.

The nonflammable characteristic, mechanical strength and 1 GHz-electric wave absorbing power of the electric wave absorber were measured by the same measurement method as in Embodiment 1 and shown in the following Table 2.

(Example B10)

A slurry of the following composition for an electric wave absorbing molded body was prepared by use of a Henschel mixer. A plate-like electric wave absorber having a size 650 mm×1400 mm×15 mm and having a sectional structure shown in FIG. 5 was produced in the same manner as in Embodiment 1 except that the aforementioned slurry was used. Then, the electric wave absorber was dried at 60° C. for 7 days. The electric wave absorber was provided so that nonflammable layers each made from a nonflammable sheet were integrally bonded to opposite sides of the electric wave absorber. The specific gravity of the electric wave absorber was 0.33 g/cm3. The amount of the electrically conductive member (graphite) contained in the electric wave absorbing molded body was 40 g/l. The nonflammable characteristic and mechanical strength of the electric wave absorber were measured by the same measurement method as in Embodiment 1 and shown in the following Table 2.

Composition of Slurry for Electric Wave Absorbing Molded Body

SHIRASU balloon (mean grain size: 50 to 400 μm) (SANKILITE made by Sanki Engineering Co., Ltd.)

220 parts by weight graphite (blue-P made by Nippon Graphite Industries, Ltd.)

50 parts by weight inorganic adhesive agent (FJ294 made by Tokiwa Electric Co.)

175 parts by weight water 550 parts by weight

Then, a wedge-shaped electric wave absorber was produced by use of the aforementioned plate-like electric wave absorber in the same manner as in Example 1. The electric wave absorbing power of the electric wave absorber was measured at 1 GHz by the same measurement method as in Embodiment 1 and shown in the following Table 2.

(Comparative Example)

First, a slurry of the following composition for an electric wave absorbing molded body was prepared by a Henschel mixer.

Composition of slurry for Electric Wave Absorbing Molded Body

SHIRASU balloon (mean grain size: 50 to 400 μm) (SANKILITE made by Sanki Engineering Co., Ltd.)

220 parts by weight graphite (blue-P made by Nippon Graphite Industries, Ltd.)

50 parts by weight inorganic adhesive agent (FJ294 made by Tokiwa Electric Co.)

175 parts by weight water 550 parts by weight

Then, the aforementioned slurry was injected in a mold and dried at 60° C. for 24 hours so that a plate-like electric wave absorber having a size 650 mm×1400 mm×15 mm was produced. Then, the electric wave absorber was dried at 60° C. for 7 days. The specific gravity of the electric wave absorber was 0.31 g/cm3. The amount of the electrically conductive member (graphite) contained in the electric wave absorber was 40 g/l. The nonflammable characteristic and mechanical strength of the electric wave absorber were measured by the same measurement method as in Example 1 and shown in the following Table 2.

Then, a wedge-shaped electric wave absorber having a base 600 mm×600 mm and being 1300 mm high as shown in FIG. 2 was produced by use of the aforementioned plate-like electric wave absorber in the same manner as in Example 1. The electric wave absorbing power of the electric wave absorber was measured at 1 GHz by the same measurement method as in Embodiment 1 and shown in the following Table 2.

TABLE 2

| Electric Wave Absorber | Specific Gravity (g/cm3) | Nonflammable Characteristic | strength (kgf cm2) | Mechanical Reflectivity (dB) |
|---|---|---|---|---|
| Example B1 | 0.32 | Good (761° C.) | 3.2 | −22 |
| Example B2 | 0.31 | Good (759° C.) | 3.0 | −22 |
| Example B3 | 0.27 | Good (765° C.) | 4.1 | −28 |
| Example B4 | 0.30 | Good (760° C.) | 3.3 | −20 |
| Example B5 | 0.33 | Good (764° C.) | 2.8 | −24 |
| Example B6 | 0.26 | Good (758° C.) | 3.5 | −20 |
| Example B7 | 0.29 | Good (765° C.) | 4.6 | −21 |
| Example B8 | 0.28 | Good (762° C.) | 4.3 | −26 |
| Example B9 | 0.28 | Good (759° C.) | 4.2 | −26 |
| Example B10 | 0.33 | Good (761° C.) | 2.0 | −24 |
| Comparative Example | 0.31 | Good (765° C.) | 0.4 | −23 |

*: The temperature of a test piece due to heating was shown in parentheses on the column for evaluation of nonflammable characteristic.

As shown in 2, it was confirmed that the electric wave absorbers in Embodiments 1 to 10 were low in specific gravity, light in weight and excellent in nonflammable characteristic, mechanical strength and electric wave absorbing power. It was further confirmed that the characteristic was enhanced more greatly when inorganic reinforcing fiber was used in combination with a powdered or granulated material of SHIRASU balloons (Examples 1 to 9).

On the contrary, the electric wave absorber without any nonflammable layer in Comparative Example was small in mechanical strength so that it was unable to be put to practical use.

As described above in detail, according to the present invention, not only the electric wave absorbing molded body as one of constituent members of the electric wave absorber exhibits excellent electric wave absorbing power but also the nonflammable layer integrally bonded to the electric wave absorbing molded body gives both mechanical strength and nonflammable characteristic to the electric wave absorber. Accordingly, the electric wave absorber is excellent in electric wave absorbing power, wide in electric wave absorption frequency band and high in withstanding electric power. Furthermore, the electric wave absorber is light in weight and excellent both in mechanical strength and in nonflammable characteristic. Accordingly, not only safety in work environment can be improved but also reduction of production cost can be achieved.

What is claimed is:

1. An electric wave absorber comprising:
   an electrically conductive member including at least one of carbon black, graphite and carbon fiber;
   a powdered or granulated material of an inorganic hollow body; and
   inorganic reinforcing fiber,
   wherein said powdered or granulated material of the inorganic hollow body, said inorganic reinforcing fiber and said electrically conductive member are bonded by an inorganic adhesive agent; and
   wherein said electric wave absorber is provided with a nonflammable layer which is integrally bonded to at least one portion thereof and which is constituted by at least one member of the group consisting of a nonflammable sheet made from a slurry containing sepiolite as a main component, and an inorganic coating agent layer.

2. An electric wave absorber according to claim 1, wherein the amount of said electrically conductive member is in a range of from 0.5 to 80 g/l.

3. An electric wave absorber according to claim 2, wherein the amount of carbon black and graphite as said electrically conductive member is in a range of from 30 to 50 g/l.

4. An electric wave absorber according to claim 2, wherein the amount of carbon fiber as said electrically conductive member is in a range of from 0.5 to 15 g/l.

5. An electric wave absorber according to claim 1, wherein said inorganic hollow body is constituted by at least one member of the group consisting of SHIRASU balloons, silica balloons, glass beads, and alumina-silica balloons.

6. An electric wave absorber according to claim 1, wherein the mean grain size of said inorganic hollow body is in a range of from 5 to 1000 µm.

7. An electric wave absorber according to claims 1, wherein said inorganic reinforcing fiber is constituted by at least one member of the group consisting of glass fiber, rock wool fiber, stainless steel fiber, silica-alumina fiber, and potassium titanate fiber.

8. An electric wave absorber according to claim 1, wherein the amount of said inorganic reinforcing fiber is in a range of from 1 to 20 g/l.

9. An electric wave absorber according to claim 1, wherein the nonflammable layer is a nonflammable sheet made from a slurry containing sepiolite as a main component.

10. An electric wave absorber according to claim 1, wherein said electric wave absorber is provided as a quadrangular pyramid- or wedge-shaped structure which is hollow in its inside.

11. An electric wave absorber according to claim 9, wherein said electric wave absorber is provided as a quadrangular pyramid- or wedge-shaped structure which is hollow in its inside.

12. An electric wave absorber according to claim 11, wherein said nonflammable layer is integrally bonded to at least one exposed portion of said electric wave absorber.

13. An electric wave absorber comprising:
   an electric wave absorbing molded body which includes:
      an electrically conductive member having at least one of carbon black, graphite, and carbon fiber, and a powdered or granulated material of an inorganic hollow body bonded to said electrically conductive member by an inorganic adhesive agent; and
   a nonflammable layer integrally bonded to at least one portion of said electric wave absorbing molded body, said nonflammable layer being at least one of a nonflammable sheet made from a slurry containing sepiolite as a main component, and an inorganic coating agent layer.

14. An electric wave absorber according to claim 13, wherein said inorganic hollow body is made from at least one member of the group consisting of SHIRASU balloons, silica balloons, glass beads, and alumina-silica balloons.

15. An electric wave absorber according to claim 13, wherein the amount of said electrically conductive member contained in said electric wave absorbing molded body is in a range of from 0.5 to 80 g/l.

16. An electric wave absorber according to claim 15, wherein the amount of carbon black and/or graphite contained as said electrically conductive member is in a range of from 30 to 50 g/l.

17. An electric wave absorber according to claim 15, wherein the amount of carbon fiber contained as said electrically conductive member is in a range of from 0.5 to 15 g/l.

18. An electric wave absorber according to claims 13, wherein the mean grain size of said inorganic hollow body is in a range of from 5 to 1000 $\mu$m.

19. An electric wave absorber according to claim 13, wherein said electric wave absorbing molded body contains inorganic reinforcing fiber in addition to said powdered or granulated material of said inorganic hollow body.

20. An electric wave absorber according to claim 19, wherein said inorganic reinforcing fiber is constituted by at least one member of the group consisting of glass fiber, rock wool fiber, stainless steel fiber, silica-alumina fiber, and potassium titanate fiber.

21. An electric wave absorber according to claim 19, wherein the amount of said inorganic reinforcing fiber contained in said electric wave absorbing molded body is in a range of from 1 to 20 g/l.

22. An electric wave absorber according to claims 13, wherein said electric wave absorber is provided as a quadrangular pyramid- or wedge-shaped structure which is hollow in its inside.

23. An electric wave absorber according to claim 22, wherein said nonflammable layer is integrally bonded to at least one face of said electric wave absorber exposed to the outside.

24. An electric wave absorber according to claim 13, wherein the nonflammable layer is a nonflammable sheet made from a slurry containing sepiolite as a main component.

25. A method of making an electric wave absorber, the method comprising laminating a nonflammable layer to an electric wave absorber; and forming the electric wave absorber of claim 1.

26. A method of making an electric wave absorber, the method comprising laminating a nonflammable layer to an electric wave absorber; and forming the electric wave absorber of claim 13.

* * * * *